United States Patent
Mao et al.

(10) Patent No.: US 11,083,109 B2
(45) Date of Patent: Aug. 3, 2021

(54) HEAT EXCHANGE SYSTEM

(71) Applicant: HONGFUJIN PRECISION ELECTRONICS (TIANJIN) CO., LTD., Tianjin (CN)

(72) Inventors: Tze-Chern Mao, New Taipei (TW);
Yen-Chun Fu, New Taipei (TW);
Chih-Hung Chang, New Taipei (TW);
Chao-Ke Wei, New Taipei (TW);
Li-Wen Chang, New Taipei (TW);
Ching-Tang Liu, New Taipei (TW);
Hung-Chou Chan, New Taipei (TW)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 977 days.

(21) Appl. No.: 15/678,029

(22) Filed: Aug. 15, 2017

(65) Prior Publication Data
US 2018/0376622 A1 Dec. 27, 2018

(30) Foreign Application Priority Data
Jun. 21, 2017 (CN) .......................... 201710477148.8

(51) Int. Cl.
*H05K 7/20* (2006.01)
*F28D 21/00* (2006.01)
(Continued)

(52) U.S. Cl.
CPC .......... *H05K 7/20745* (2013.01); *F01K 7/16* (2013.01); *F17C 9/04* (2013.01); *F24F 5/00* (2013.01);
(Continued)

(58) Field of Classification Search
CPC ......... H05K 7/20745; F01K 7/16; F17C 9/04; F24F 5/00; F24F 5/0035;
(Continued)

(56) References Cited

U.S. PATENT DOCUMENTS

2013/0160486 A1* 6/2013 Amir ...................... F01K 25/10
62/611
2013/0291567 A1* 11/2013 Bohra ...................... F17C 5/06
62/48.1
(Continued)

FOREIGN PATENT DOCUMENTS

CN 104197576 A 12/2014
CN 204301358 U 4/2015
(Continued)

OTHER PUBLICATIONS

Machine Translation of CN 104197576, original published Dec. 10, 2014.*

*Primary Examiner* — Mark A Laurenzi
*Assistant Examiner* — Mickey H France
(74) *Attorney, Agent, or Firm* — ScienBiziP, P.C.

(57) ABSTRACT

A heat exchange system includes a heat-absorbing substance such as Liquid Natural Gas (LNG), a heat dissipation apparatus, a water storage tank, a heating portion, and a cooling portion. The heating portion is coupled between the LNG and the water storage tank. The cooling portion is coupled between the heat dissipation apparatus and the water storage tank. The cooling portion transfers heat of the heat dissipation apparatus to water of the water storage tank to heat the heating portion, and the heating portion transfers heat of the water of the water storage tank to the LNG.

17 Claims, 10 Drawing Sheets

(51) Int. Cl.
*F01K 7/16* (2006.01)
*F28D 20/00* (2006.01)
*F24F 5/00* (2006.01)
*F17C 9/04* (2006.01)
*F28D 15/00* (2006.01)
*F24F 13/30* (2006.01)

(52) U.S. Cl.
CPC .......... *F24F 5/0017* (2013.01); *F24F 5/0035* (2013.01); *F24F 13/30* (2013.01); *F28D 15/00* (2013.01); *F28D 20/0034* (2013.01); *F28D 21/001* (2013.01); *F24F 2005/0025* (2013.01); *F28D 21/0001* (2013.01); *Y02B 30/54* (2013.01); *Y02E 60/14* (2013.01)

(58) Field of Classification Search
CPC .............. F24F 2005/0025; F28D 15/00; F28D 20/0034; F28D 21/001; F28D 21/0001
USPC ..................................... 60/643–684, 614–620
See application file for complete search history.

(56) References Cited

U.S. PATENT DOCUMENTS

| | | | |
|---|---|---|---|
| 2014/0260253 A1* | 9/2014 | Oney | F01K 25/08 60/660 |
| 2016/0281932 A1* | 9/2016 | Karlsson | F02M 37/007 |
| 2017/0038008 A1* | 2/2017 | Tada | F17C 9/04 |

FOREIGN PATENT DOCUMENTS

| | | | | |
|---|---|---|---|---|
| JP | 56148605 A | * | 11/1981 | |
| JP | 58135308 A | * | 8/1983 | ............. F01K 25/10 |
| JP | 59051112 A | * | 3/1984 | ............. F01K 25/10 |
| JP | 03003902 A | * | 1/1991 | ............. F01K 9/003 |

* cited by examiner

HEAT EXCHANGE SYSTEM

FIELD

The subject matter herein generally relates to equipment cooling and a heat exchange system for the purpose.

BACKGROUND

Liquefied natural gas (LNG) needs to absorb heat to change to the gaseous state. In another aspect, an apparatus, such as data center, generates a lot of heat that needs to be dissipated.

BRIEF DESCRIPTION OF THE DRAWINGS

Implementations of the present disclosure will now be described, by way of example only, with reference to the attached figures.

DETAILED DESCRIPTION

Figure 1:
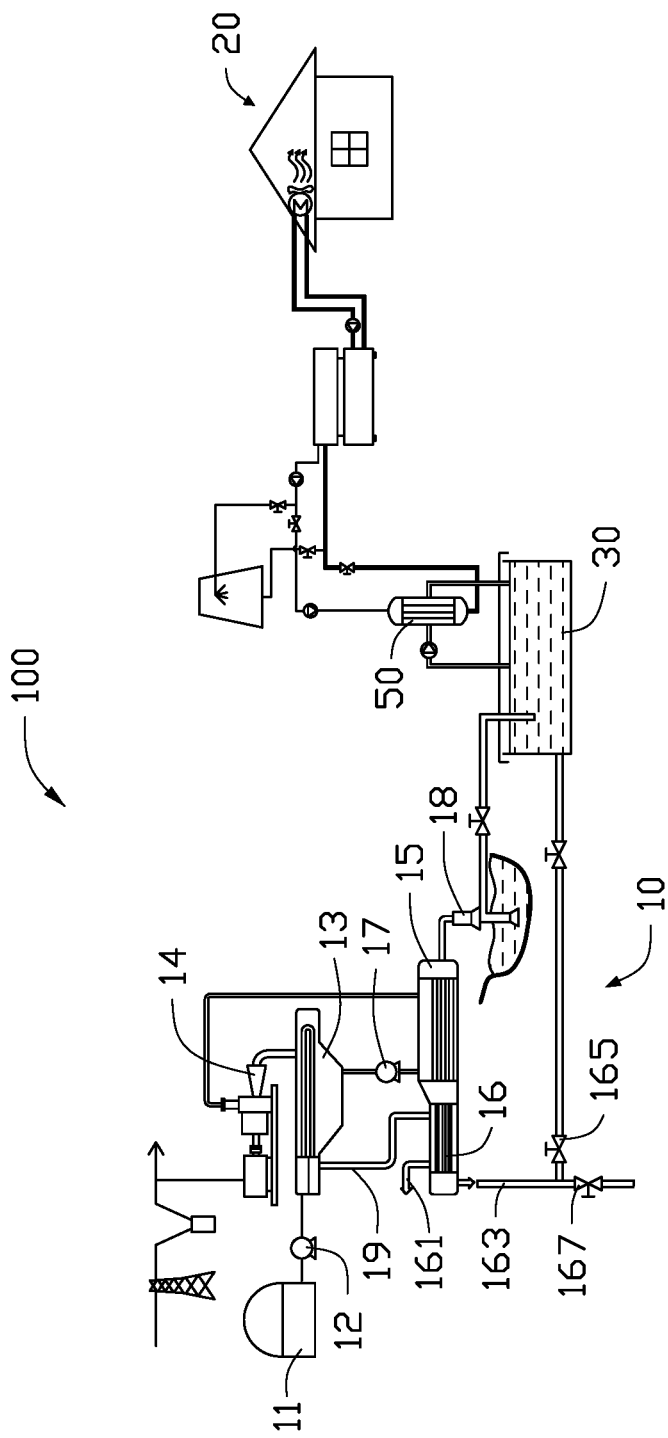
FIG. 1 is a schematic diagram of an exemplary embodiment of a heat exchange system.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected.

The term "comprising" means "including, but not necessarily limited to"; it specifically indicates open-ended inclusion or membership in a so-described combination, group, series, and the like.

FIG. 1 illustrates a heat exchange system 100 for exchanging heat between a container of liquefied natural gas (LNG) (not shown) and a data center (not shown). The heat exchange system 100 includes a heating portion 10, a cooling portion 20, and a water storage tank 30. The heating portion 10 is configured to heat LNG that is stored in a LNG tank 11. The cooling portion 20 is configured to cool a heat dissipation apparatus, such as a data center, a workshop, or an office building.

In at least one exemplary embodiment, the heating portion 10 includes a first pump 12, a first heat exchanger 13, a turbine 14, a second heat exchanger 15, a third heat exchanger 16, a second pump 17, a third pump 18, and a pipe 19. The first pump 12 is coupled between the LNG tank 11 and the first heat exchanger 13. The pipe 19 is coupled between the first heat exchanger 13 and the third heat exchanger 16 to transfer natural gas to the third heat exchanger 16 from the first exchanger 13.

Figure 2:
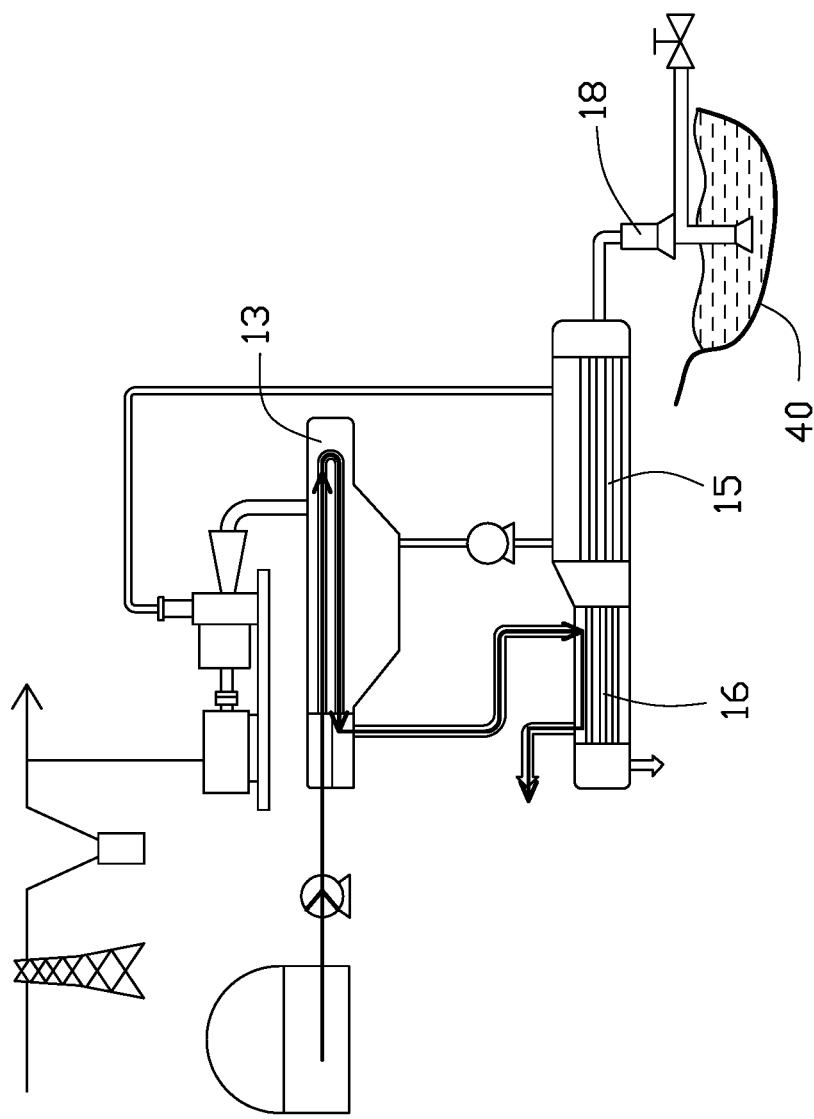
FIG. 2 is a diagram of a heating portion of the heat exchange system of FIG. 1.

In at least one exemplary embodiment, the third pump 18 is coupled between water storage tank 30 and the second heat exchanger 15. The third pump 18 is configured to pump water from the water storage tank 30 into the second heat exchanger 15. Further, the third pump 18 can pump water from a pool 40 into the second heat exchanger 15 when the water in the water storage tank 30 is not needed as shown in FIG. 2. The second exchanger 15 is coupled to the third heat exchanger 16 and transfers water to the third heat exchanger 16.

A plurality of intermediate heating medium fills the second heat exchanger 15. The plurality of intermediate heating medium is separated from a water pumped (not shown) by the third pump 18. The plurality of intermediate heating medium absorbs heat of the water in the heat exchanger 15.

The second heat exchanger 15, the second pump 17, the first heat exchanger 13, and the turbine 14 make up a loop for the plurality of intermediate heating medium flowing therein. The intermediate heating medium flows passed the first heat exchanger 13 to be made liquid, the second pump 17 drives the intermediate heating medium to flow from the first heat exchanger 13 into the second heat exchanger 15, and then flow through the turbine 14 to rotate the turbine 14 to generate electrical power. The generated electrical power is provided to an electric power system (not labeled). After the turbine 14, the flows back to the first heat exchanger 13. In the first heat exchanger 13, the intermediate heating medium and the LNG are isolated, and heat of the intermediate heating medium is transferred to the LNG.

The third exchanger 16 includes a gas outlet 161 and a water outlet 163. In the third exchanger 16, LNG flows from the first heat exchanger 13 and water flows from the second heat exchanger 15, and heat of the water is transferred to the LNG to gasify the LNG.

The gasified LNG is outputted from the gas outlet 161. Water flows out of the third exchanger 16 through the water outlet 163. Water can flow back to the water storage tank 30 through a first valve 165, or be discharged through a second valve 167.

FIG. 2 illustrates the LNG flowing in the heating portion 10. The LNG flows passed the first heat exchanger 13 and the third heat exchanger 16 to be made gaseous natural gas. When LNG is located in the first heat exchanger 13, heat is transferred from the water to the intermediate heating medium, and the heat is transferred from intermediate heating medium to the LNG.

Figure 3:
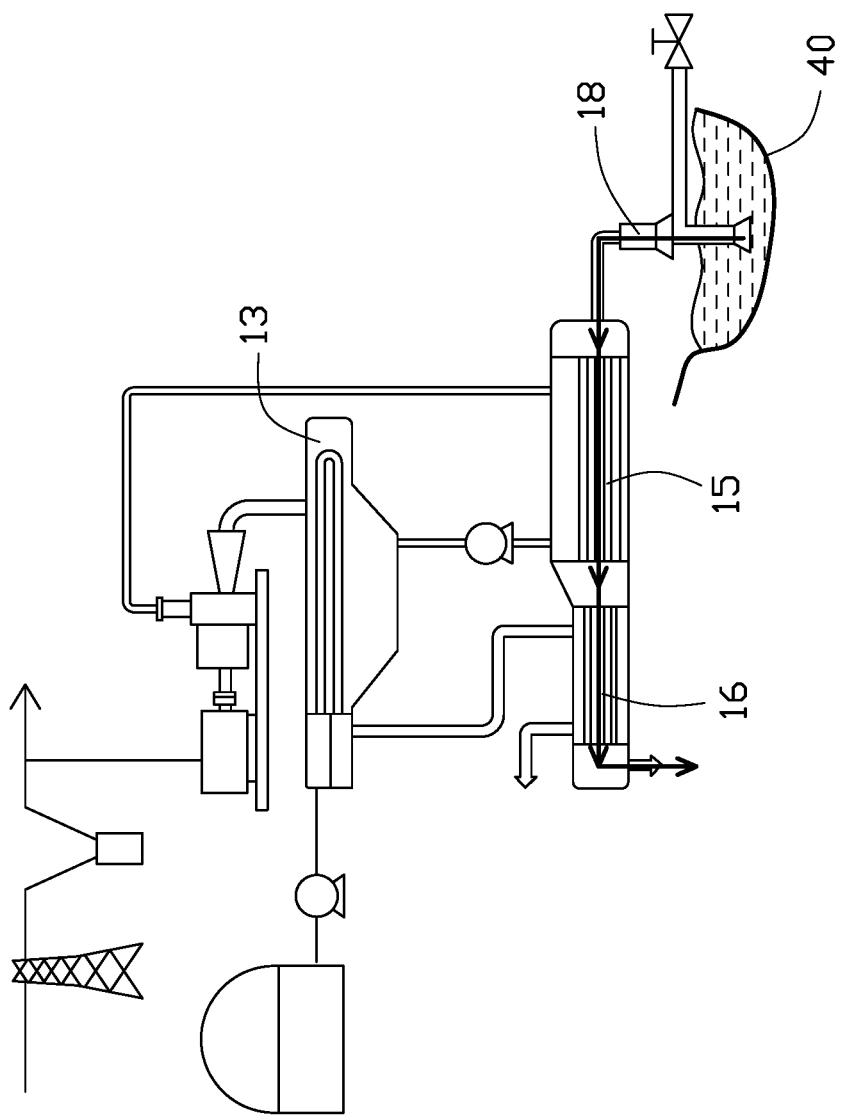
FIG. 3 is another diagram of the heating portion of the heat exchange system of FIG. 1.

FIG. 3 illustrates the water flowing in the heating portion 10. Water pumped from the water storage tank 30 or the pool 40 flows through the second heat exchanger 15 and the third heat exchanger 16. When water is in the first heat exchanger 15 heat is transferred from the water to the intermediate heating medium, and the heat is transferred from intermediate heating medium to the LNG.

Figure 4:
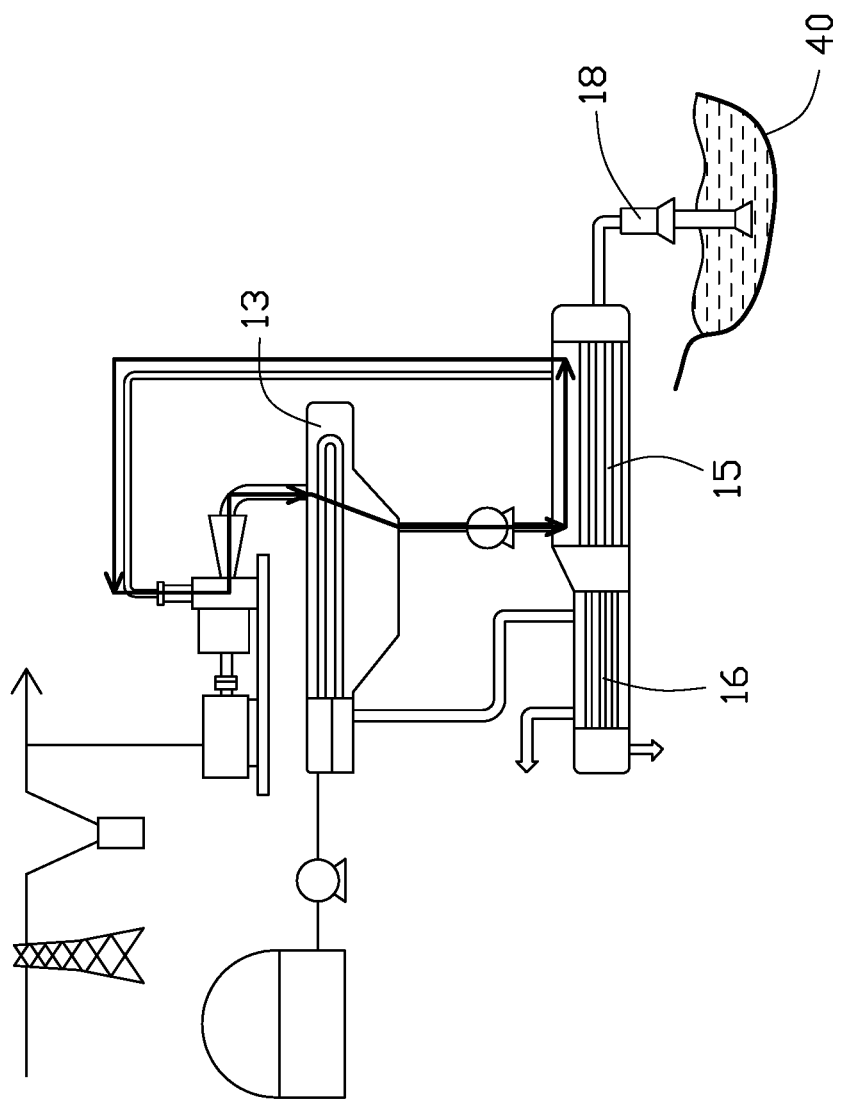
FIG. 4 is another diagram of the heating portion of the heat exchange system of FIG. 1.

FIG. 4 illustrates the intermediate heating medium flowing in the loop. The intermediate heating medium flows from the first heat exchanger 13 to the second heat exchanger 15 and back to the first heat exchanger 13. When the intermediate heating medium is in the second heat exchanger 15, heat of the water is transferred to the intermediate heating medium. When the intermediate heating medium is in the first heat exchanger 13, heat of the intermediate heating medium is transferred to the LNG.

Figure 5:
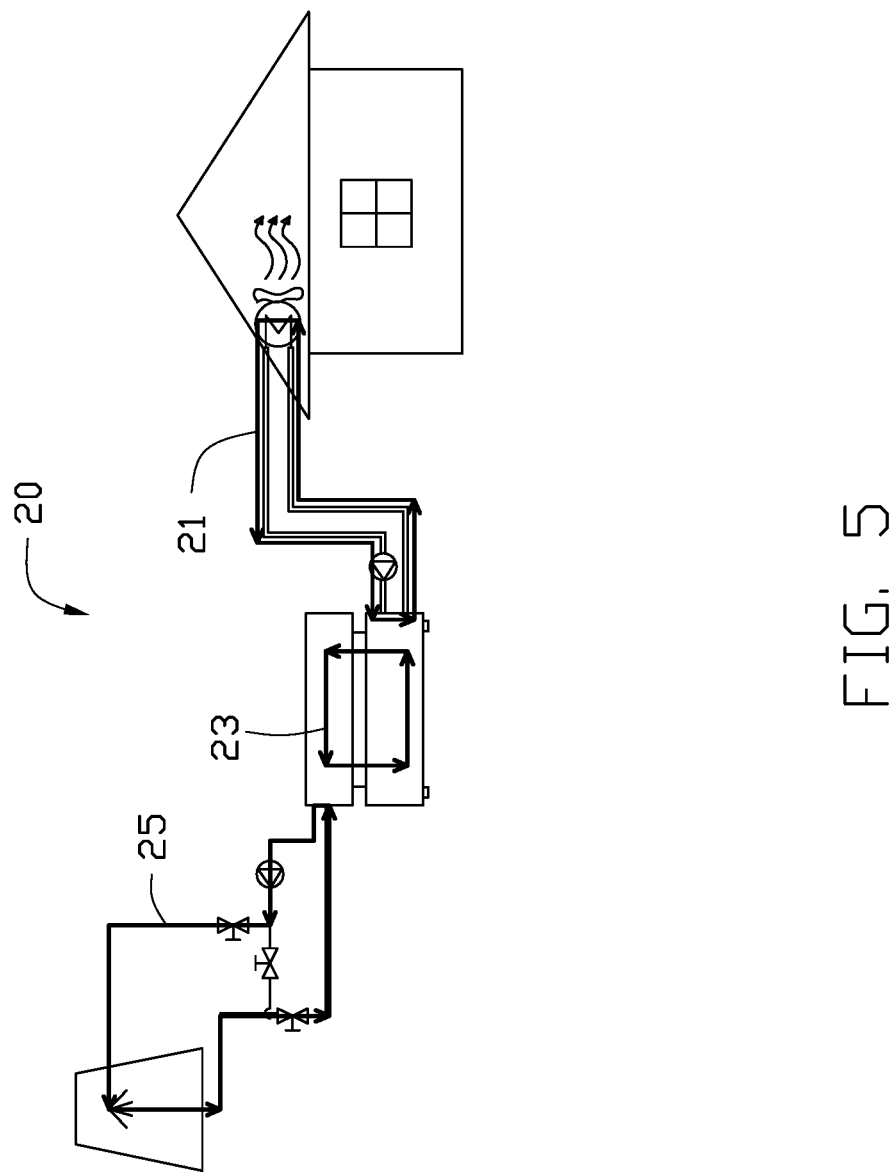
FIG. 5 is a diagram of a cooling portion of the heat exchange system of FIG. 1.

FIG. 5 illustrates that the cooling portion 20 includes a chilled water loop 21, a cooling medium loop 23, and a cooling water loop 25. Chilled water flows in the chilled water loop 21 to absorb heat of a heat dissipation apparatus through a fourth heat exchanger (not shown) and dissipate heat to cooling medium of the cooling medium loop 23. The cooling medium dissipates heat to cooling water of the cooling water loop 25 through a fifth exchanger (not shown). The cooling water of the cooling water loop 25 flows through a water tower 27 to dissipate heat of the cooling water. In one exemplary embodiment, the cooling medium loop 23 includes a compressor (not shown) to add pressure to the cooling medium.

Figure 6:
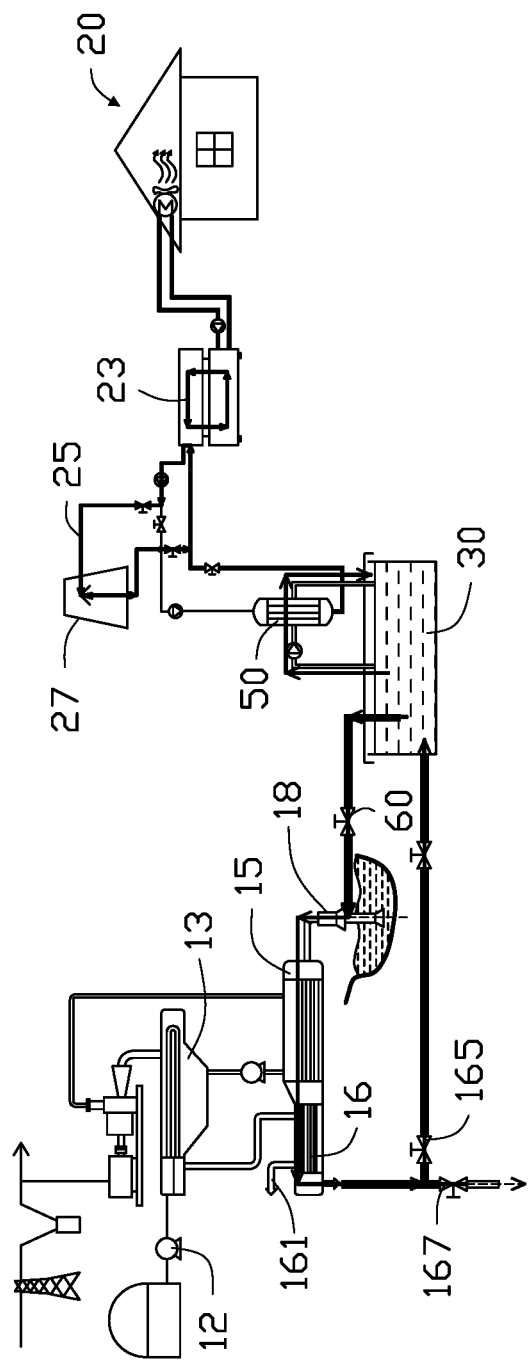
FIG. 6 is diagram of another exemplary embodiment of the heat exchange system.

FIG. 6 illustrates that the cooling water loop 25 includes a sixth heat exchanger 50, which is coupled to a water tower 27 and the cooling medium loop 23. Further, the sixth heat exchanger 50 is coupled to the water storage tank 30. Thus, the cooling water of cooling water loop 25 transfers heat to the water of the water storage tank 30 through the sixth heat exchanger 50.

A valve 60 is coupled between the water storage tank 30 and the third pump 18. When the valve 60 is opened, the pump 18 pumps the water from the water storage tank 30 to the second heat exchanger 15 and the third heat exchanger 16. In another exemplary embodiment, the pump 18 can pump water from the water storage tank 30 and from the pool 40 according to a preset ratio.

In the above exemplary embodiment, heat of the heat dissipation apparatus is transferred to the water of the water storage tank 30 through the chilled water loop 21, the cooling medium loop 23, and the cooling water loop 25 of the cooling portion 20.

Heat of the water of the water storage tank 30 is transferred to the LNG through the first heat exchanger 13, the second heat exchanger 15, and the third heat exchanger 16 of the heating portion 10. Therefore, the heat of the heat dissipation apparatus is transferred to the LNG through the heat exchange system.

Figure 7:
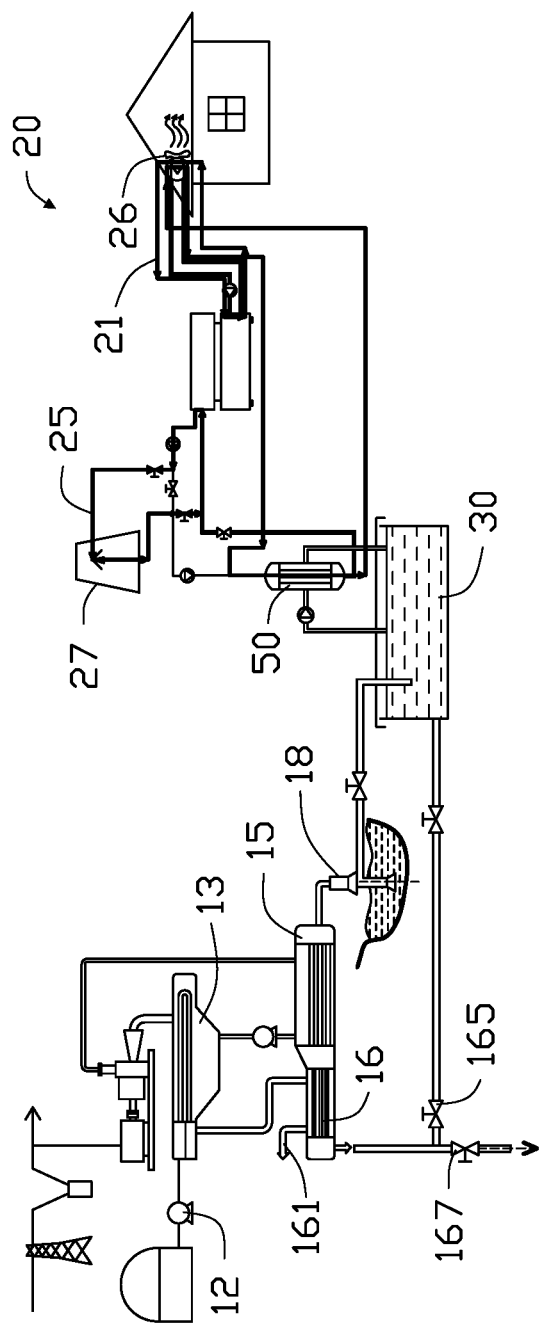
FIG. 7 is diagram of another exemplary embodiment of the heat exchange system.

FIG. 7 illustrates another exemplary embodiment of the heat exchange system 100.

In this exemplary embodiment, a pipe is connected between the sixth heat exchanger 50 of the cooling water loop 25 and the chilled water loop 21.

When a temperature of the water in the water storage tank 30 is lower than a lowest temperature of the chilled water in the chilled water loop 21, the chilled water of the chilled water loop 21 flows in the sixth heat exchanger 50 to dissipate heat from the water of the water storage tank 30. Further, the chilled water loop 21 includes a fan 26, which functions as a heat exchanger, for transferring heat of air to the chilled water of the water storage tank 30.

In another exemplary embodiment, when the heat-absorbing qualities or quantity of the LNG is insufficient, and all heat of the heat dissipation apparatus cannot be absorbed, the chilled water loop 21, the cooling medium loop 23, and the cooling water loop 25 can be utilized to dissipate more heat of the heat dissipation apparatus.

Figure 8:
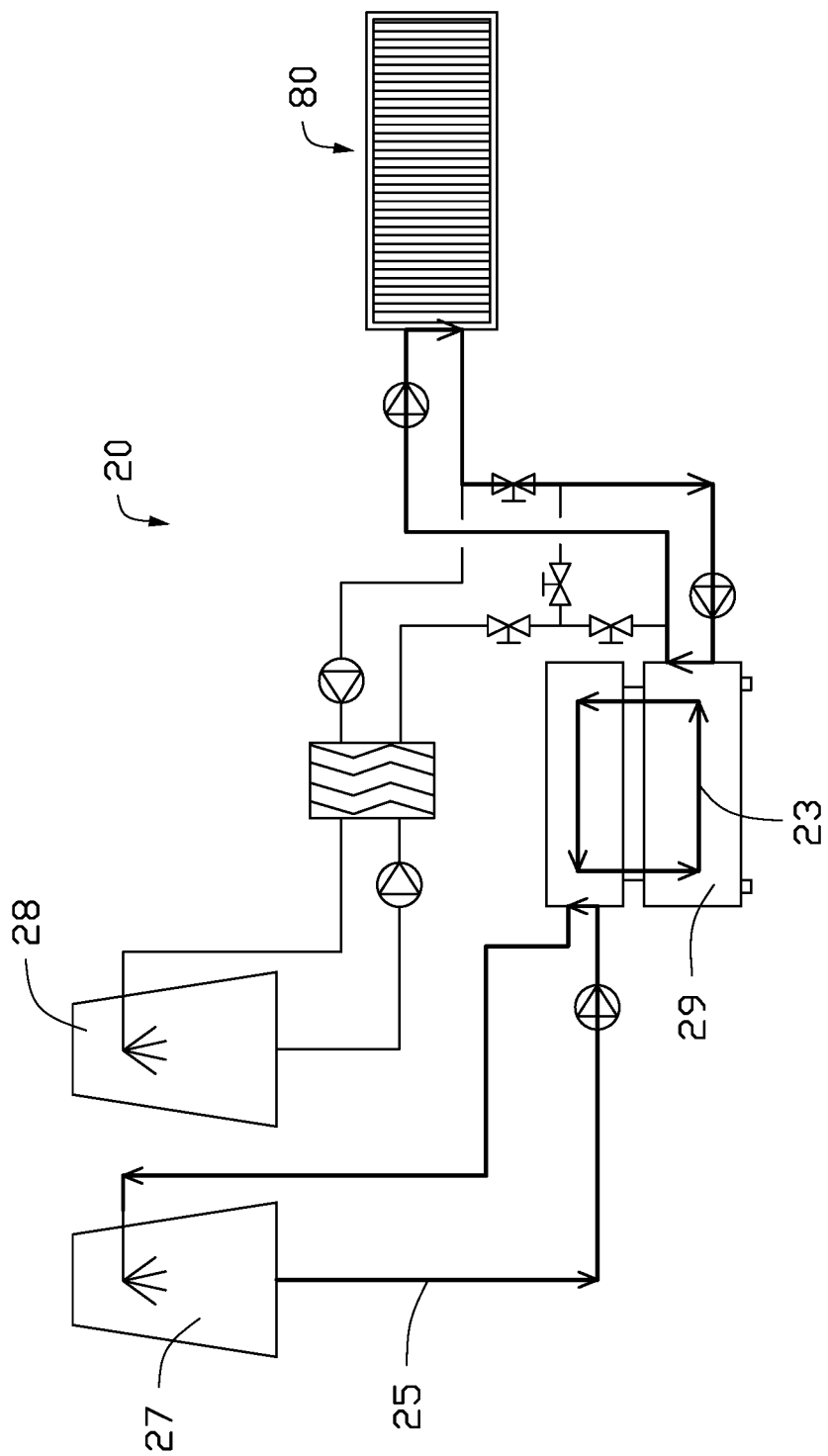
FIGS. 8 and 9 are diagram of another exemplary embodiment of the heat exchange system.
Figure 9:
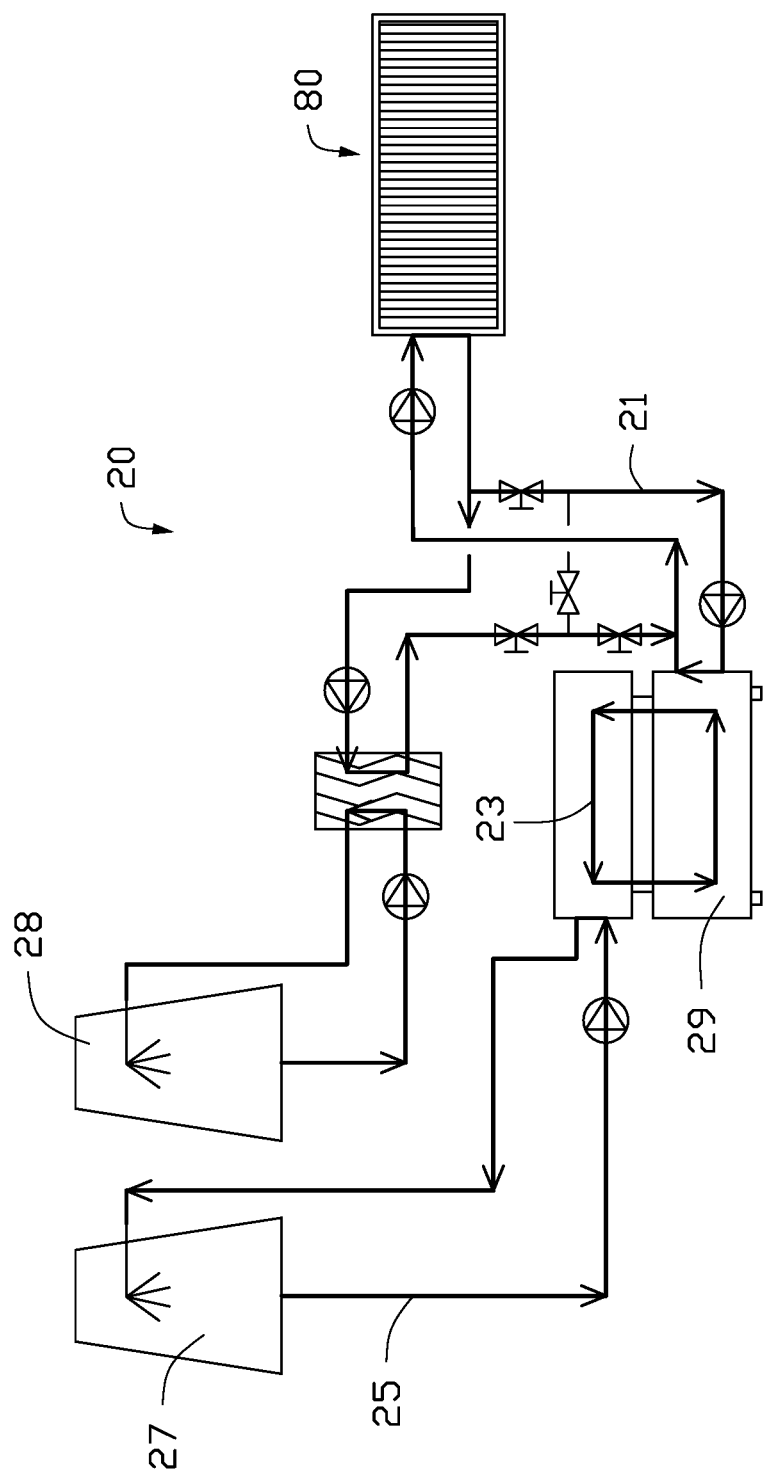

FIGS. 8 and 9 illustrates another exemplary embodiment of heat exchange system.

In this exemplary embodiment, the cooling water loop 25 of the cooling portion 20 further includes another water tower 28. When the surrounding temperature is low, the water tower 28 can dissipate heat of the chilled water in the chilled water loop 21.

Therefore, a work load of a compressor 29 of the cooling medium loop 23 can be reduced to save power. When the surrounding temperature is not low and the water tower 28 does not dissipate sufficient heat, the compressor 29 can work at greater power to absorb more heat from the chilled water. Therefore, the heat dissipation apparatus 80 can be cooled.

Figure 10:
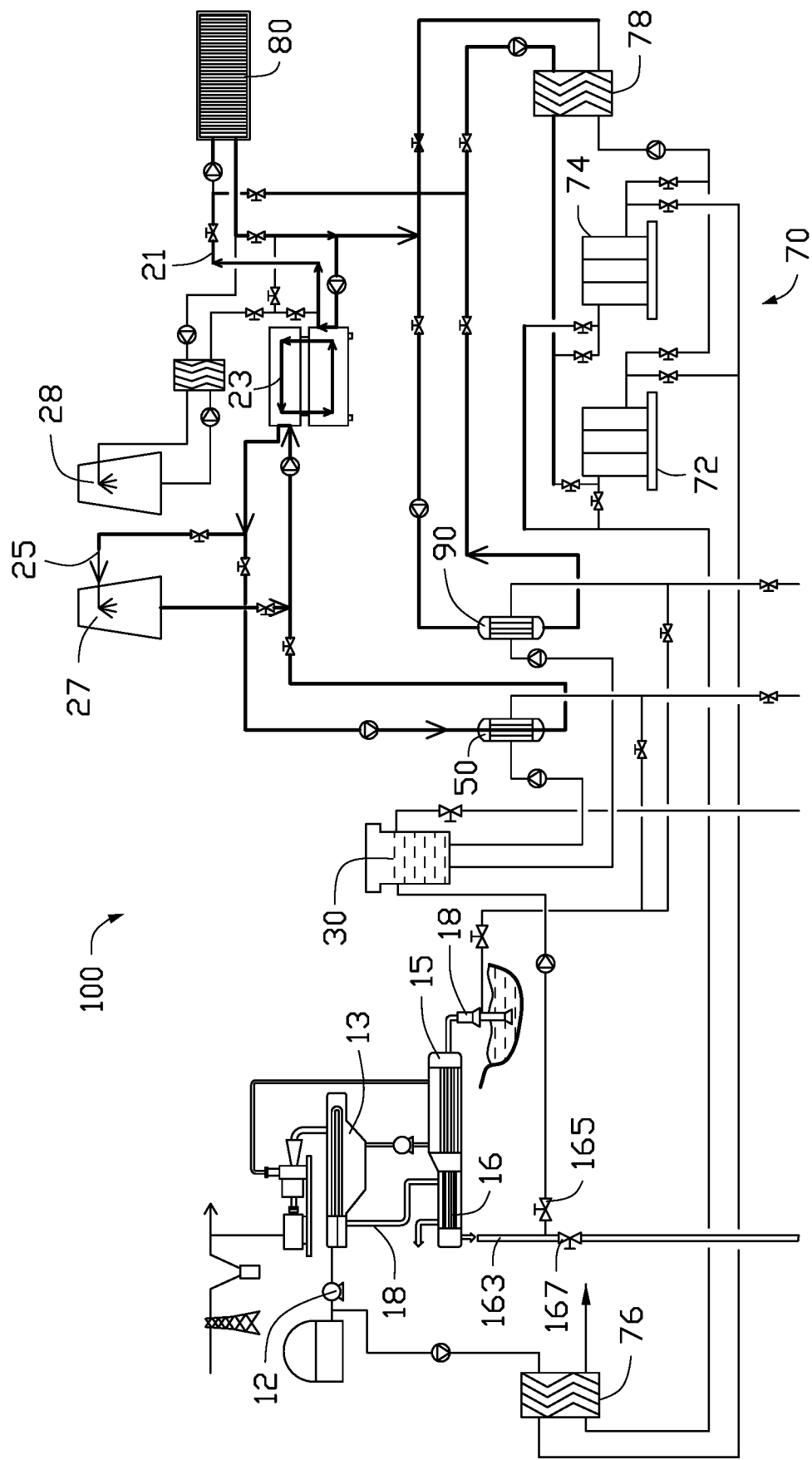
FIG. 10 is diagram of another exemplary embodiment of the heat exchange system.

FIG. 10 illustrates another exemplary embodiment of the heat exchange system. In this exemplary embodiment, the heat exchange system further includes a seventh heat exchanger 90, which is coupled between the chilled water loop 21 and the water storage tank 30.

The heat exchange system further includes a storing portion 70, an eighth heat exchanger 76, and a ninth heat exchanger 78.

In an exemplary embodiment, the eighth heat exchanger 76 and the ninth heat exchanger 78 are each a plate type heat exchanger.

The storing portion 70 includes a first storage tank 72 and a second storage tank 74. The storing portion 70 is coupled between the heating portion 10 and the heat dissipation apparatus 80 through the eighth heat exchanger 76 and the ninth heat exchanger 78. The first storage tank 72 and the second storage tank 74 store the cooling capacity of a cold source discharged from the heating portion 10, and cool heat dissipation apparatus 80.

When a temperature of the water in the water storage tank 30 is lower than the lowest temperature of the chilled water in the chilled water loop 21, the chilled water of the chilled water loop 21 flows in the seventh heat exchanger 90 to directly dissipate heat into the water of the water storage tank 30.

When the temperature of the water in the water storage tank 30 is between the lowest temperature of the chilled water and the highest temperature of the chilled water, the sixth heat exchange 50 and the seventh heat exchanger 90 work simultaneously to dissipate heat of the chilled water.

In another exemplary embodiment, when the LNG can absorb more heat than that being dissipated from the heat dissipation apparatus, water in the water storage tank 30 or other container can be employed to transfer heat. In another aspect, when the heat dissipation apparatus dissipates more heat than the LNG can absorb water in the water storage tank 30 or other container can heat other apparatus.

In other exemplary embodiment, the LNG can be replaced by other substance, which needs to be heated or can efficiently absorb heat, such as liquid nitrogen, liquid ammonia, and so on.

The exemplary embodiments shown and described above are only examples. Many details are often found in the art such as the other features of heat exchanger system. Therefore, many such details are neither shown nor described.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A heat exchange system comprising:
a cold source to be heated;
a heat dissipation apparatus to be cooled;
a water storage tank;
a first heat exchanger coupled between the cold source and the water storage tank;
a storage tank coupled to the heating portion; and
a second heat exchanger coupled between the heat dissipation apparatus and the water storage tank;
wherein the second heat exchanger transfers heat of the heat dissipation apparatus to water in the water storage tank to heat the first heat exchanger, the first heat exchanger transfers heat of the water in the water storage tank to the cold source to heat the cold source, and the storage tank stores the cold source to cool the heat dissipation apparatus; and
wherein the second heat exchanger comprises a chilled water loop, a cooling medium loop, and a cooling water loop, chilled water flows in the chilled water loop to absorb heat of the heat source and dissipate heat to cooling medium of the cooling medium loop, the cooling medium dissipates heat to cooling water of the cooling water loop, and the cooling water of the cooling water loop transmits heat to water of the water storage tank.

2. The heat exchange system of claim 1, wherein the cold source is liquefied natural gas (LNG), the LNG is stored in a LNG tank.

3. The heat exchange system of claim 1, wherein the first heat exchanger comprises a first sub heat exchanger and a second sub heat exchanger, the first sub heat exchanger and the second sub heat exchanger are coupled to form a loop, a intermediate heating medium flows in the loop, water of the water storage tank flows in the second sub exchanger to transfer heat to the intermediate heating medium, and the cold source flows in the first sub exchanger to absorb heat of the intermediate heating medium.

4. The heat exchange system of claim 3, wherein the cold source and the intermediate heating medium are separated in the first sub heat exchanger, and the intermediate heating medium and the water are separated in the second sub heat exchanger.

5. The heat exchange system of claim 3, wherein a first pump is coupled between the cold source and the first sub heat exchanger, and the first pump pumps the cold source into the first sub heat exchanger.

6. The heat exchange system of claim 3, wherein a second pump is coupled between the first sub heat exchanger and the second sub heat exchanger, and the second pump drives the plurality of intermediate heating medium to flow in the loop.

7. The heat exchange system of claim 6, wherein a turbine is in the loop, and the plurality of intermediate heating medium flows through the turbine to generate electric power.

8. The heat exchange system of claim 3, wherein a third pump is coupled between the second sub heat exchanger and the water storage tank, and the third pump pumps water of the water storage tank into the second sub heat exchanger.

9. The heat exchange system of claim 3, wherein the first heat exchanger further comprises a third sub heat exchanger, and the cold source flows from the first sub heat exchanger into the third sub heat exchanger, and the water flows from the second sub heat exchanger into the third sub heat exchanger to dissipate heat to the cold source.

10. The heat exchange system of claim 9, wherein the third sub heat exchanger comprises a gas outlet, and the cold source is gasified in the third sub heat exchanger and is outputted through the gas outlet.

11. The heat exchange system of claim 9, wherein the third sub heat exchanger comprises a water outlet, and water in the third sub heat exchanger flows out of the third sub heat exchanger and flows back to the water storage tank.

12. The heat exchange system of claim 1, wherein the storage tank comprises a first sub storage tank and a second sub storage tank, the first sub storage tank and the second sub storage tank store the cold source to cool the heat dissipation apparatus.

13. The heat exchanger system of claim 1, wherein the cooling water of the cooling water loop transfers heat to water of the water storage tank through a sixth heat exchanger.

14. The heat exchanger system of claim 13, wherein the cooling water loop comprises a water tower to dissipate heat of the cooling water.

15. The heat exchanger system of claim 13, wherein the chilled water loop is coupled to the sixth heat exchanger, and the chilled water of the chilled water loop flows in the sixth heat exchanger to dissipate heat to the water of the water storage tank when a temperature of the water in the water storage tank is lower than a lowest temperature of the chilled water in the chilled water loop.

16. The heat exchanger system of claim 13, wherein the first heat exchanger comprises a water tower coupled to the chilled water loop, and the water tower dissipates heat of the chilled water in the chilled water loop.

17. The heat exchanger system of claim 13, wherein a seventh heat exchanger is coupled between the chilled water loop and the water storage tank, and the seventh heat exchanger transfers heat of chilled water of the chilled water loop to water of the water storage tank.

* * * * *